United States Patent
Shannon et al.

(10) Patent No.: US 6,693,610 B2
(45) Date of Patent: *Feb. 17, 2004

(54) ACTIVE MATRIX ELECTROLUMINESCENT DISPLAY DEVICE

(75) Inventors: John M. Shannon, Whyte Leafe (GB); Alan G. Knapp, Crawley (GB)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

This patent is subject to a terminal disclaimer.

(21) Appl. No.: 10/361,736

(22) Filed: Feb. 10, 2003

(65) Prior Publication Data

US 2003/0122747 A1 Jul. 3, 2003

Related U.S. Application Data

(62) Division of application No. 09/658,925, filed on Sep. 11, 2000, now Pat. No. 6,542,138.

(30) Foreign Application Priority Data

Sep. 11, 1999 (GB) ............................................. 9921425
Mar. 13, 2000 (GB) ............................................. 0005811

(51) Int. Cl.⁷ ................................................. G09G 3/30
(52) U.S. Cl. ........................ 345/76; 345/77; 315/169.3
(58) Field of Search ........................ 345/76, 77, 74.1, 345/75.1, 75.2, 78, 79, 80, 81, 82, 83; 315/169.1, 169.3

(56) References Cited

U.S. PATENT DOCUMENTS

| | | | | | |
|---|---|---|---|---|---|
| 3,659,159 A | * | 4/1972 | Nagata | ........................ | 345/3.1 |
| 5,235,253 A | * | 8/1993 | Sato | ........................ | 315/169.3 |
| 6,028,576 A | * | 2/2000 | Hush | ........................ | 345/75.1 |
| 6,384,804 B1 | * | 5/2002 | Dodabalapur et al. | ........ | 345/82 |
| 6,518,962 B2 | * | 2/2003 | Kimura et al. | ............... | 345/211 |
| 6,542,138 B1 | * | 4/2003 | Shannon et al. | ............... | 345/76 |

FOREIGN PATENT DOCUMENTS

| | | | | |
|---|---|---|---|---|
| EP | 0653741 A1 | 5/1995 | ............ | G09G/3/30 |
| EP | 0717446 A2 | 6/1996 | ............ | H01L/27/15 |
| EP | 0923067 A1 | 6/1999 | ............ | G09G/3/30 |
| WO | WO9636959 | 11/1996 | ............ | G09G/3/30 |
| WO | WO9965012 | 12/1999 | ............ | G09G/3/30 |

* cited by examiner

Primary Examiner—Xiao Wu (57) ABSTRACT

An active matrix electroluminescent display device in which the drive current through an electroluminescent display element (20) in each pixel (10) in a drive period is controlled by a driving device (22) based on a drive signal applied during a preceding address period and stored as a voltage on an associated storage capacitor (36). In order to counteract the effects of display element ageing, through which the light output for a given drive signal level diminishes over time, the pixel includes electro-optic discharging means (40) coupled to the storage capacitor and responsive to the display element's light output to leak stored charge and to control the integrated light output of the display element in the drive period. For improved control, the discharging means is arranged to rapidly discharge the capacitor at a controlled point in the drive period, upon the drive of the display element falling to a low level. A photoresponsive transistor can conveniently be utilised for this purpose.

10 Claims, 6 Drawing Sheets

ACTIVE MATRIX ELECTROLUMINESCENT DISPLAY DEVICE

CROSS REFERENCE TO RELATED APPLICATIONS

This is a divisional of application Ser. No. 09/658,925, filed Sep. 11, 2000, now U.S. Pat. No. 6,542,138.

This invention relates to active matrix electroluminescent display devices comprising an array of electroluminescent display pixels. In particular, the invention relates to an active matrix electroluminescent display device comprising an array of display pixels each comprising an electroluminescent display element and a driving device for controlling the current through the display element in a drive period based on a drive signal applied to the pixel during an address period preceding the drive period and stored as a charge on a storage capacitance associated with the driving device.

Matrix display devices employing electroluminescent, light-emitting, display elements are well known. The display elements may comprise organic thin film electroluminescent elements, for example using polymer materials, or else light emitting diodes (LEDs) using traditional III–V semiconductor compounds. Recent developments in organic electroluminescent materials, particularly polymer materials, have demonstrated their ability to be used practically for video display devices. These materials typically comprise one or more layers of an electroluminescent material, for example a semiconducting conjugated polymer, sandwiched between a pair of electrodes, one of which is transparent and the other of which is of a material suitable for injecting holes or electrons into the polymer layer. The polymer material can be fabricated using a CVD process, or simply by printing or a spin coating technique using a solution of a soluble conjugated polymer.

Organic electroluminescent materials exhibit diode-like I–V properties, so that they are capable of providing both a display function and a switching function, and can therefore be used in passive type displays.

However, the invention is concerned with active matrix display devices, with each pixel comprising a display element and a switching device for controlling the current through the display element. Examples of an active matrix electroluminescent (EL) display devices are described in EP-A-0653741 and EP-A-0717446. Unlike active matrix liquid crystal display devices in which the display elements are capacitive and therefore take virtually no current and allow a drive signal voltage to be stored on the capacitance for the whole frame period, the EL display elements need to continuously pass current to generate light. A driving device of a pixel, usually comprising a TFT, (thin film transistor), is responsible for controlling the current through the display element. The brightness of the display element is dependent on the current flowing through it. During an address period for a pixel, a drive (data) signal determining the required output from the display element is applied to the pixel and stored as a corresponding voltage on a storage capacitance which is coupled to, and controls the operation of, the current controlling drive device with the stored voltage serving to maintain operation of the switching device in supplying current through the display element during a subsequent drive period, corresponding to a frame period, until the pixel is addressed again.

A problem with known organic electroluminescent materials, particularly polymer materials, is that they exhibit poor stability and suffer ageing effects whereby for example the light output for a given drive current is reduced over a period of time of operation. While in certain applications such ageing effects may not be critical, the consequences in a pixellated display can be serious as any slight variations in light output from pixels can easily be perceived by a viewer.

It is an object of the present invention to provide an active matrix electroluminescent display device in which this problem is overcome at least to an extent.

In the absence of developments in the electroluminescent materials themselves to improve their stability, it is believed that electronic techniques can be employed to provide appropriate electrical correction for the effects of such degradation.

According to the present invention there is provided an active matrix electroluminescent display device comprising an array of display pixels each of which comprises an electroluminescent display element and a driving device for controlling the current through the display element in a drive period based on a drive signal applied to the pixel during an address period preceding the drive period and stored as a charge on a storage capacitance associated with the driving device, which is characterised in that each pixel includes electrooptic discharging means coupled to the storage capacitance for controlling the amount of light output from the pixel in the drive period which discharging means is responsive to light produced by the display element during the drive period and arranged to leak charge from the storage capacitance at a rate dependent on the display element light output.

Thus, a given stored signal voltage for determining a desired light output level of the display element of a pixel following addressing is progressively changed in the drive period according to the light output characteristic of the pixel's display element through operation of the discharging means in the drive period, with the light output acting as a feedback variable, whereby the operation of the driving device controlling energisation of the element (and hence light output therefrom) in the driving period is correspondingly progressively adjusted. The proportion of the available drive period for which the display element is energised to produce light output is therefore dependent on, and regulated by, the action of the discharging means in discharging the storage capacitance according to its light output. In this way, the integrated light output from a display element in a frame period can be controlled so as to counteract the effects of ageing and improved uniformity of display output is obtained even though the degradation of individual display elements differs.

In order to obtain approximately a similar maximum amount of light from a degraded display element in the drive period, which corresponds approximately to a frame period less the row address period, the amount of charge initially stored in the storage capacitance in the address period may be increased slightly compared with that in the known display device by increasing the magnitude of the data signal appropriately so that a similar number of photons to that produced from an undegraded display element can be obtained from the degraded display element before the value stored on the storage capacitance is reduced through operation of the discharging means, at a rate dependent on the light emission of the display element, until the driving device begins to turn off. Alternatively, the drive voltage applied to the display elements can be adjusted appropriately. Thus, the amount of light produced by the degraded (aged) display element can be maintained similar to that from the display element before degradation.

The driving devices of the pixels preferably comprise TFTs and may be either n type or p type TFTs, for example polysilicon MOS TFTs. References herein to discharging should therefore be construed appropriately in relation to the nature of the charge stored on the storage capacitances in the address phase for both cases.

The discharging means preferably comprises a photoresponsive element in the form of a photodiode which photodiode is connected to the storage capacitance and arranged to be reverse biased in the drive period so as to leak charge from the storage capacitance in response to light from the display element falling thereon. Although it is envisaged that a photoresponsive device other than a photodiode and operable in response to light falling thereon to leak charge from the storage capacitance at a rate dependent on the level of the incident light in the drive period may alternatively be used, a photodiode is preferred for this purpose as its operation in leaking is independent of the voltage across it and substantially linearly proportional to incident light level.

With the driving device comprising a current-controlling transistor (TFT) connected in series with the display element between two supply lines at different voltage levels, and with the storage capacitance being connected between the gate node of the transistor and one of the supply lines, as in the known device, then the photodiode can be connected, with appropriate polarity to be reverse biased, in parallel with the storage capacitance between the gate node and that supply line. Photocurrents generated in the photodiode by light from the display element result in leakage through the photodiode of the stored charge and gradual reduction of the voltage at the gate node.

In a comparatively simple embodiment of the invention, the discharging means may solely comprise a photodiode operating in the aforementioned manner. Such an arrangement would be beneficial in overcoming to a useful extent problems due to display element degradation in many situations.

However, if merely a photoresponsive element such as a reverse-biased photodiode connected across the storage capacitance is used as the discharging means, problems may be experienced. As a result of the operation of the discharging means in discharging the storage capacitance, the level of light produced from the display element gradually diminishes during the drive period and this will lead to the display element being turned off in a slow manner which may not be adequately precise for the regulation control desired. At comparatively low light output levels the operation of the pixel would become less-well controlled. Typically the characteristics of a photodiode are such that it becomes much less efficient at relatively low light levels. Also, in the case where the driving devices comprise TFTs, the operation of an individual driving device becomes less well defined as the gate voltage begins to approach its threshold voltage and so non-uniform operation of the devices of the array could occur.

In a preferred embodiment of the invention, therefore, the discharging means is further arranged to rapidly discharge the storage capacitance and curtail light output from the display element at a point in the drive period which is controlled by, and dependent on, the operation of the display element. The operation of the discharging means in this respect is preferably determined by an operational characteristic indicative of the light output of the display element dropping to a certain, lower, level. Consequently, problems due to the nature of the behaviour of a photo-responsive element such as a photodiode at low light levels and the operation of the driving TFT close to its threshold voltage are avoided. The discharging means could be made responsive directly to the light output of the display element for this purpose but, preferably, the operation of the discharging means in this respect is made dependent on an electrical parameter that varies in accordance with the drive level of the display element, for example according to the level of electrical current flowing through the display element or a voltage in the pixel circuit which varies in accordance with such current (the light level of the display element being dependent on this current). The controlled point is then determined by the electrical parameter reaching a predetermined level. This enables electrically, rather than optically, responsive switching devices or circuits to be used for this purpose.

Because the light output from the display element is suddenly terminated rather than diminishing very gradually, grey scales are made easier to control and efficiency is improved.

In this embodiment, the discharging means may comprise a photoresponsive element, again preferably a reverse-biased photodiode, connected across the storage capacitance and responsive to light generated by the display element to leak away charge stored on the storage capacitance slowly, and a switching device, such as a transistor, which is connected in parallel with the photoresponsive element across the storage capacitance and responsive to current flow through the display element to discharge the storage capacitance rapidly upon the level of current flow through the display element reaching a certain, low, level.

Preferably, however, the discharging means comprises a photoresponsive transistor connected across the storage capacitance through which charge is leaked away by photocurrents generated therein by light from the display element and whose gate is coupled to a source of potential dependent on the current flowing through the display element. One current carrying electrode of the transistor, for example the drain junction, can be arranged reverse biased and responsive to light falling thereon so that the drain-source path behaves as a reverse-biased photodiode while the transistor is off and with the potential applied to its gate controlling its switching operation. Thus, only one device is needed to fulfil the required functions for the discharging means of, initially, slow and, subsequently rapid discharge of the capacitance. Such a transistor is relatively simple and convenient to fabricate alongside, and simultaneously with, the transistors of the active matrix circuit, e.g. the driving TFTs.

Conveniently, the gate of the photo-responsive transistor may be coupled to the node between the display element and the driving device. The voltage at this node varies according to the level of current flow through the display element. As the storage capacitance discharges due to photocurrent in the photo-responsive transistor, the gate voltage decreases and the voltage across the display element increases until at a certain point the photoresponsive transistor's threshold level is reached causing it to turn on and rapidly discharge the capacitance.

When using a TFT as the driving device of a pixel, the invention offers a further important advantage. Since the drive current for a display element is determined by the voltage applied to the gate of the TFT, corresponding to the voltage stored in the capacitance, this drive current depends strongly on the characteristics of the TFT and so any variations in the threshold voltage, mobility and dimensions of the individual TFTs of pixels over the array, for example due to manufacturing process tolerances, can produce unwanted variations in the display element currents and hence output light levels produced, which causes non-uniformities in the display output. The effect of the discharging means in controlling the stored voltage signal will also compensate to an extent for such variations in TFT characteristics.

A further advantage is that the operation of the discharging means can also negate at least to some extent problems due to voltage drops occurring during the drive period in a common current line connected to, and shared by, the display elements of, for example, all the pixels of a row.

Although the invention is particularly beneficial in devices using polymer LED materials, it can of course be applied to advantage in any active matrix electroluminescent device in which the electroluminescent material used similarly suffers ageing effects resulting in lower light output levels for a given drive current over a period of time of operation.

Embodiments of active matrix electroluminescent display devices in accordance with the present invention will now be described, by way of example, with reference to the accompanying drawings, in which:—

The Figures are merely schematic. The same reference numbers are used throughout the Figures to denote the same or similar parts.

Figure 1:
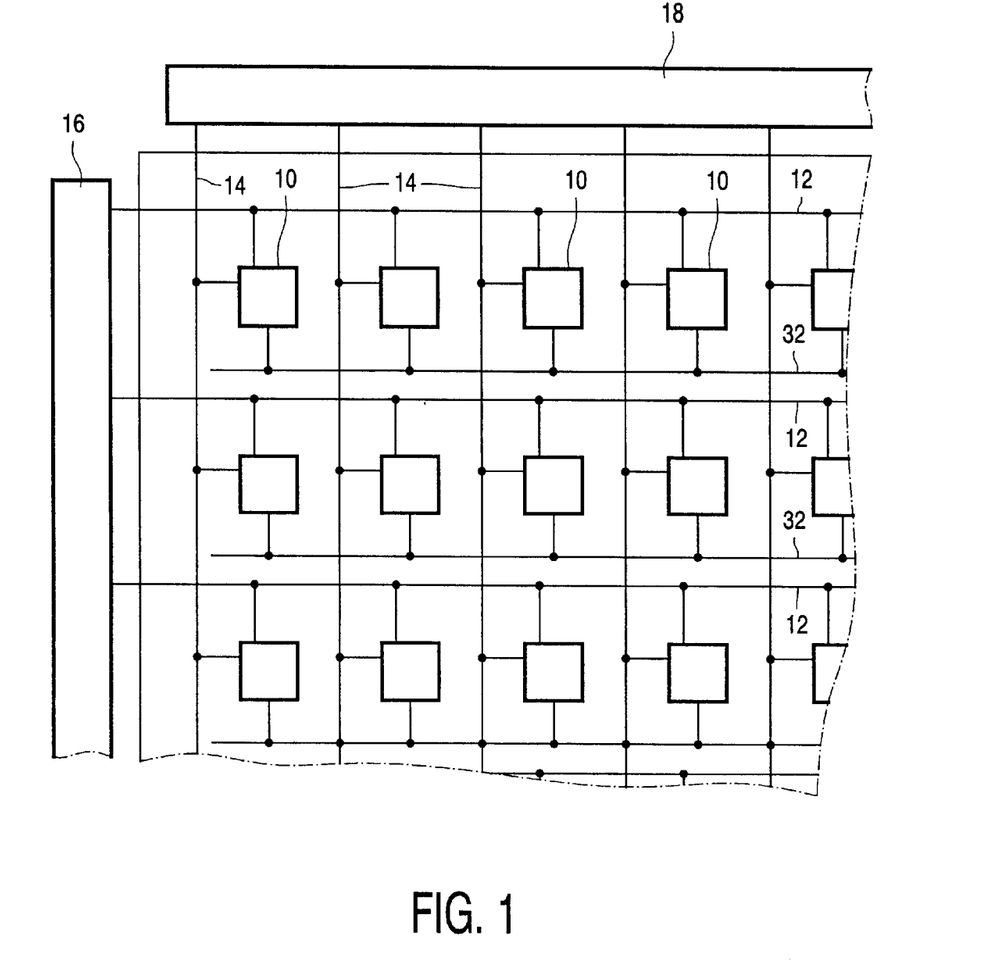
FIG. 1 is a simplified schematic diagram of known active matrix electroluminescent display device comprising an array of pixels.

Referring to FIG. 1, the active matrix electroluminescent display device comprises a panel having a row and column matrix array of regularly-spaced pixels, denoted by the blocks 10, each comprising an electroluminescent display element and an associated driving device controlling the current through the display element, and which are located at the intersections between crossing sets of row (selection) and column (data) address conductors, or lines, 12 and 14. Only a few pixels are shown for simplicity. The pixels 10 are addressed via the sets of address conductors by a peripheral drive circuit comprising a row, scanning, driver circuit 16 and a column, data, driver circuit 18 connected to the ends of the respective sets.

Each row of pixels is addressed in turn by means of a selection signal applied by the circuit 16 to the relevant row conductor 12 so as to load the pixels of the row with respective drive signals, determining their individual display outputs, according to the respective data signals supplied in parallel by the circuit 18 to the column conductors. As each row is addressed, the data signals are supplied by the circuit 18 in appropriate synchronisation.

Figure 2:
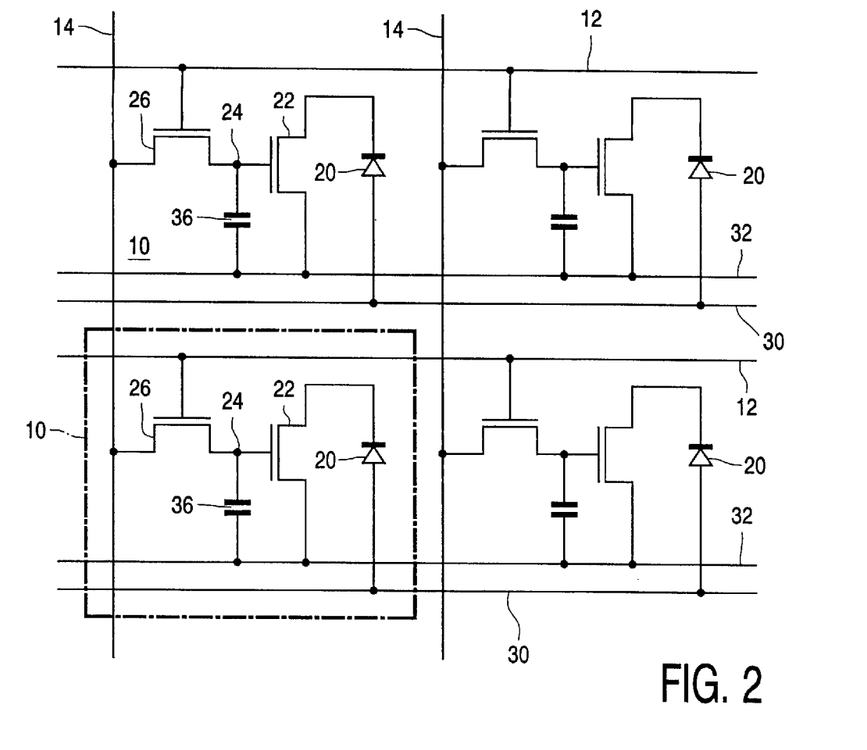
FIG. 2 shows the equivalent circuit of a few typical pixels of the known active matrix electroluminescent display device of FIG. 1.

FIG. 2 illustrates the circuit of a few, typical, pixels in this known device. Each pixel, 10, includes a light emitting organic electroluminescent display element 20, represented here as a diode element (LED), and comprising a pair of electrodes between which one or more active layers of organic electroluminescent material is sandwiched. In this particular embodiment the material comprises a polymer LED material, although other organic electroluminescent materials, such as low molecular weight materials, could be used. The display elements of the array are carried together with the associated active matrix circuitry on one side of an insulating support. Either the cathodes or the anodes of the display elements are formed of transparent conductive material. The support is of transparent material such as glass and the electrodes of the individual display elements 20 closest to the substrate can consist of a transparent conductive material such as ITO so that light generated by the electroluminescent layer is transmitted through these electrodes and the support so as to be visible to a viewer at the other side of the support. Alternatively, the light output could be viewed from above the panel and the display element anodes in this case would comprise parts of a continuous ITO layer constituting a supply line common to all display elements in the array. The cathodes of the display elements comprise a metal having a low work-function such as calcium or magnesium silver alloy. Examples of suitable organic conjugated polymer materials which can be used are described in WO 96/36959. Examples of other, low molecular weight, organic materials are described in EP-A-0717446, which also describes examples of the construction and operation of an active matrix electroluminescent device and whose disclosure in these respects is incorporated herein by reference.

Each pixel 10 includes a driving device in the form of a TFT 22 which controls the current through, and hence operation of, the display element 20 based on a data signal voltage applied to the pixel. The signal voltage for a pixel is supplied via a column conductor 14 which is shared between a respective column of pixels. The column conductor 14 is coupled to the gate of the current-controlling drive transistor 22 through an address TFT 26. The gates for the address TFTs 26 of a row of pixels are all connected to a common row conductor 12.

Each row of pixels 10 also shares a common voltage supply line 30, held at a predetermined potential and usually provided as a continuous electrode common to all pixels, and a respective common current line 32. The display element 20 and the driving device 22 are connected in series between the positive voltage supply line 30 and the common current line 32, which is at a negative potential with respect to the supply line 30, for example ground, and acts as a current source for the current flowing through the display element 20. The current flowing through the display element 20 is controlled by the switching device 22 and is a function of the gate voltage on the transistor 22, which is dependent upon a stored control signal determined by the data signal supplied to the column conductor 14.

A row of pixels is selected and addressed by the row driver circuit 16 applying a selection pulse to the row conductor 12 which switches on the address TFTs 26 for the respective row of pixels and define a respective row address period. A voltage level derived from the video information supplied to the driver circuit 18 is applied to the column conductor 14 by the driver circuit 18 and is transferred by the address TFT 26 to the gate node 24 of the drive transistor 22. During the periods when a row of pixels is not being addressed via the row conductor 12 the address transistor 26 is turned off, but the voltage on the gate node of the drive transistor 22 is maintained by a pixel storage capacitor 36 which is connected between the gate of the drive transistor 22 and the common current line 32, so as to maintain the operation of the display element during this drive period. The voltage between the gate of the drive transistor 22 and the common current line 32 determines the current passing through the display element 20 of the pixel 10. Thus, the current flowing through the display element is a function of the gate-source voltage of the drive transistor 22 (the source of the n-channel type transistor 22 being connected to the common current line 32, and the drain of the transistor 22 being connected to the display element 20). This current in turn controls the light output level (grey-scale) of the pixel.

The switching transistor 22 is arranged to operate in saturation, so that the current flowing through the transistor is insensitive to the drain-source voltage and dependent on the gate-source voltage. Consequently, slight variations of the drain voltage do not affect the current flowing through the display element 20. The voltage on the voltage supply line 30 is therefore not critical to the correct operation of the pixels.

Each row of pixels is addressed in turn in this manner in a respective row address period so as to load the pixels of each row in sequence with their drive signals and set the pixels to provide desired display outputs for the drive period, corresponding approximately to a frame period, until they are next addressed.

With this known pixel circuit, it will be appreciated that the voltage stored on the capacitor 36 is substantially determined by the applied data signal voltage and that as this voltage in turn controls the drive transistor 22 and the current through the display element 20 then the resulting light output level of the display element at any time will be dependent on the then existing current/light output level characteristic of the display element and is substantially constant throughout the frame period. The electroluminescent material of the display element can suffer degradation over a period time of operation leading to ageing effects. Ageing of an element will change the voltage drop across the element as well as the efficiency of its operation in terms of the light output provided for a particular current drive level. Either or both of these effects can contribute to the degradation problem. Those pixels which have, therefore, been driven longer (or harder) will exhibit reduced brightness and cause display non-uniformities. With polymer LED materials the effects of such ageing can be significant.

In the present invention, an opto-electronic technique is utilised in each pixel for effectively responding to display element degradation and counteracting this effect by controlling the integrated light output in a frame period accordingly. In this technique optical feedback is used in a manner such as to discharge the storage capacitor at a rate dependent on the instantaneous light emission of the display element during the driving period. Consequently, for a given data signal the length of time for which a display element is energised to generate light during the drive period following the address period is regulated according to the subsisting light emission characteristic of the display element, as well as the level of the applied data signal, such that the light output from the pixel is substantially the same as would be obtained with a non-degraded display element. If a higher brightness is required from one pixel, the display element is energised longer (up to a maximum corresponding to the available drive, frame, period) by increasing the applied data signal and vice versa.

Figure 3:
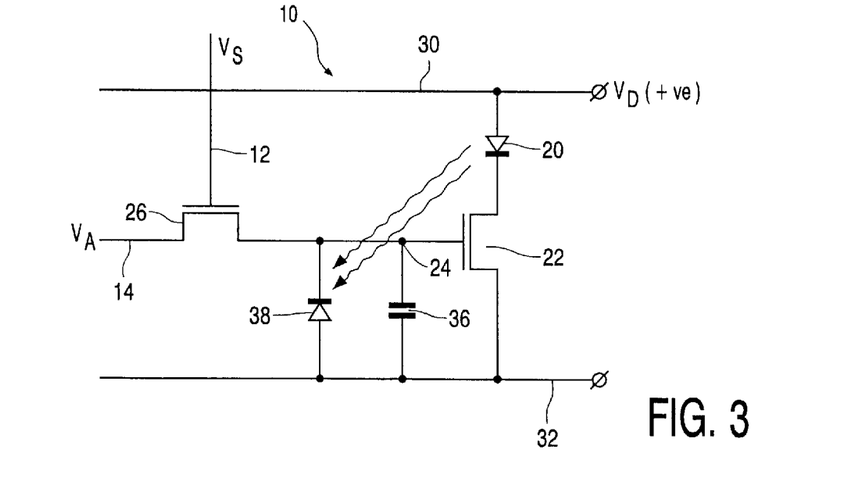
FIG. 3 shows the equivalent circuit of one typical pixel in a first embodiment of display device according to the present invention.

Referring to FIG. 3, there is shown schematically the equivalent circuit of one typical pixel in a first embodiment of display device according to the invention intended to overcome, at least to an extent, the effect of ageing using this technique. In this pixel 10 the display element 20 is similarly connected in series with the n-channel drive transistor 22 (again operating in saturation mode) between the current line 32, common to a row of pixels and for example at ground potential, and a voltage supply line 30, at a positive potential with respect to the line 32, and the gate node 24 of the TFT 22 is connected to the drain of the address transistor 26 whose gate and source terminals are supplied respectively with selection and data signals via the associated row and column conductors 12 and 14. The storage capacitor 36 is again connected between the gate node of the drive transistor 22 and the current line 32.

The pixel 10 further includes electro-optic discharging means for discharging the storage capacitor 36 which comprises a photodiode 38 connected in parallel with the storage capacitor 36 between the gate node 24 of the TFT 22 and the current line 32 and arranged in reverse-biased manner with its cathode and anode terminals connected respectively to the gate node and the line 32. The photodiode 38, for example formed from amorphous silicon and having a pin structure, is arranged physically in relation to the display element 20 so as to receive part of the light generated by the element 20 in operation of the device as indicated by the wavy arrows in FIG. 3. The photodiode may be shielded from ambient light. Like the known pixel circuit, operation of this pixel circuit has two phases, an addressing phase in which the pixel is set to a desired display output condition dependent on an applied data signal and a subsequent drive phase in which the display element is driven according to the set condition until the pixel is again addressed, for example in the next frame.

In the addressing phase, the pixel is addressed in similar manner to that previously described with a selection pulse signal being applied to the row conductor 12 so as to turn on the address TFT 26 in a respective row address period and charge the gate node of the TFT 22 to a drive signal voltage value according to the level of a data signal present on the column conductor 14. This stored value is responsible for operating the TFT 22 and determining the drive current through the display element in the drive period following the turning off of the address TFT 26 at the end of the row selection, address, period.

In the drive period, the optical coupling between the display element 22 and the reverse biased photodiode 38 means that-light emitted by the display element and incident on the photodiode generates a small photocurrent therein which is approximately linearly proportional to the instantaneous light output level. As a consequence of this photocurrent, the photodiode 38 leaks charge on the gate node 24 and the node gradually discharges through the photodiode until the gate voltage of the TFT 22 reaches its threshold level whereupon the TFT 22 turns off and current flow through the display element 20 ceases. Such discharge occurs at a rate dependent on the instantaneous light emission level of the display element.

This optical feedback technique enables the total, integrated, amount of light emitted by the display element within the drive period, which viewer perceives as brightness, to be regulated and allows the effects of display element degradation to be counteracted. The integrated light output (brightness) is dependent on the length of time in the drive period for which the display element is energised as well as its initial light level. Because of the action of the discharging means in discharging the storage capacitor at a rate dependent on the actual light output level of the display element, and thus in controlling the duration for which the display element is energised in the drive period, then different pixels in the array supplied with the same data signal value will tend to produce similar perceived brightness levels regardless of variations in the degradation of individual display elements. In other words, the integral of the light outputs from individual display elements addressed with the same data signal value will be similar even though at the start of the drive period their respective light output levels may differ due to degradation effects. The optical feedback effectively compensates for such differences by regulating the duration of energisation of individual pixels in accordance with their light output so a more uniform display output is obtainable.

As usual, the level of the applied data signal is adjusted appropriately to provide different grey-scale levels from the pixels. If the data signal, and thus charge on the gate node 24, is increased then more photons are required from the display element during the drive period before the TFT 22 is caused to switch off, so that a higher grey-scale level is achieved, and vice versa.

In order to obtain a maximum level of brightness-from degraded display elements similar to that achieved with undergraded display elements in a conventional display device, then the amplitude range for the applied data signal voltage may be correspondingly increased or, alternatively, the drive voltage level for the display elements can be adjusted appropriately, for example by increasing the voltage level of the line 30.

Figure 4:
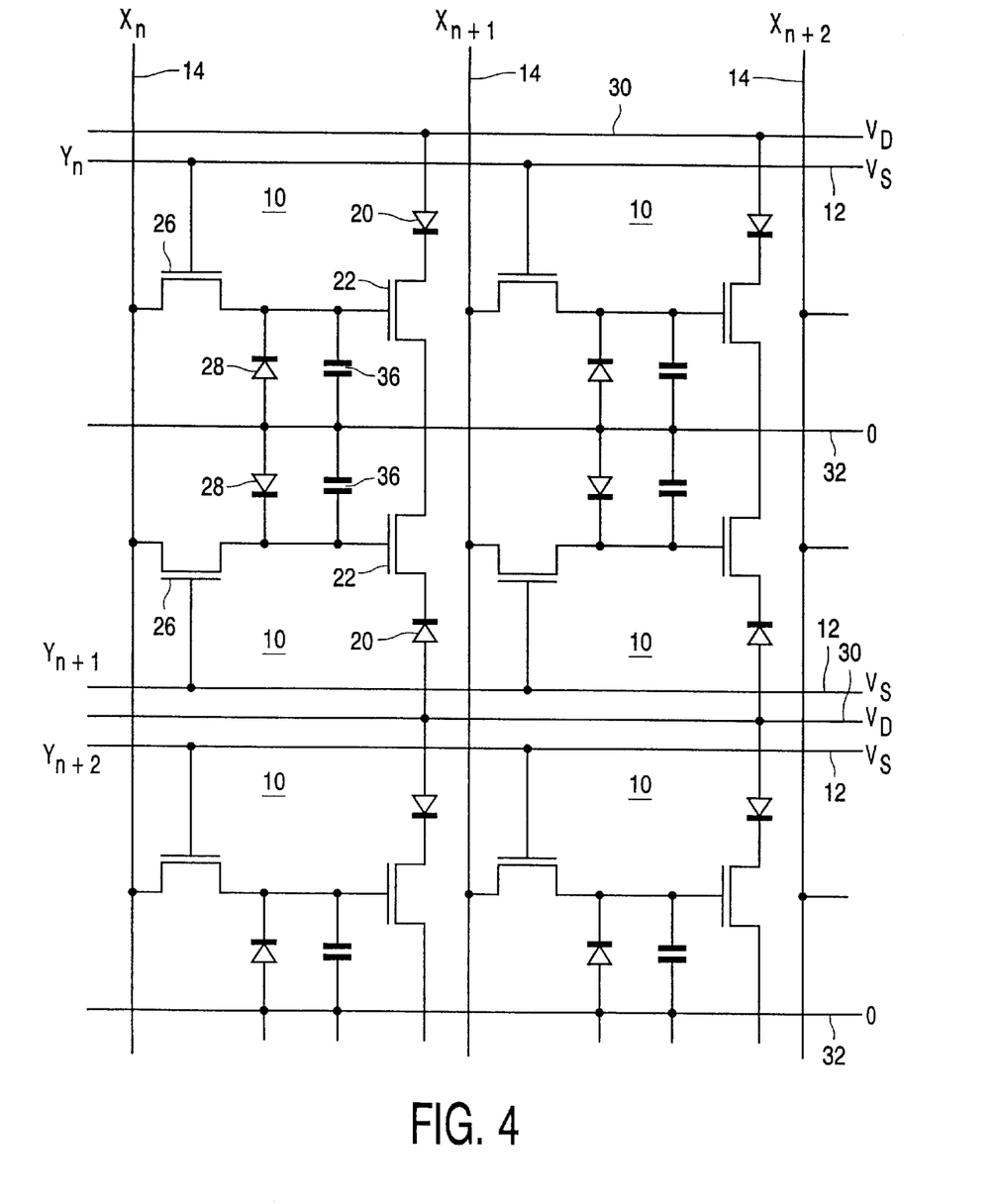
FIG. 4 shows several pixels of the device of FIG. 3 and an example of the manner of their connection.

FIG. 4 illustrates a few, typical, pixels using this circuit in an array and an example of their interconnection with common supply lines and associated row and column address lines. In this particular scheme, a respective current supply line 32 is shared by pixels in two adjacent rows. The common lines 30 may in practice be constituted by a continuous conductor layer common to all pixels. Yn, Yn+1, Yn+2 etc., are row address lines, one for each row of pixels, to which selection signals (Vs) are applied in turn to address each row of pixels in sequence, and Xn, Xn+1, Xn+2 etc., are column address lines via which the data signals are supplied to the associated pixels in a selected row.

Figure 5:
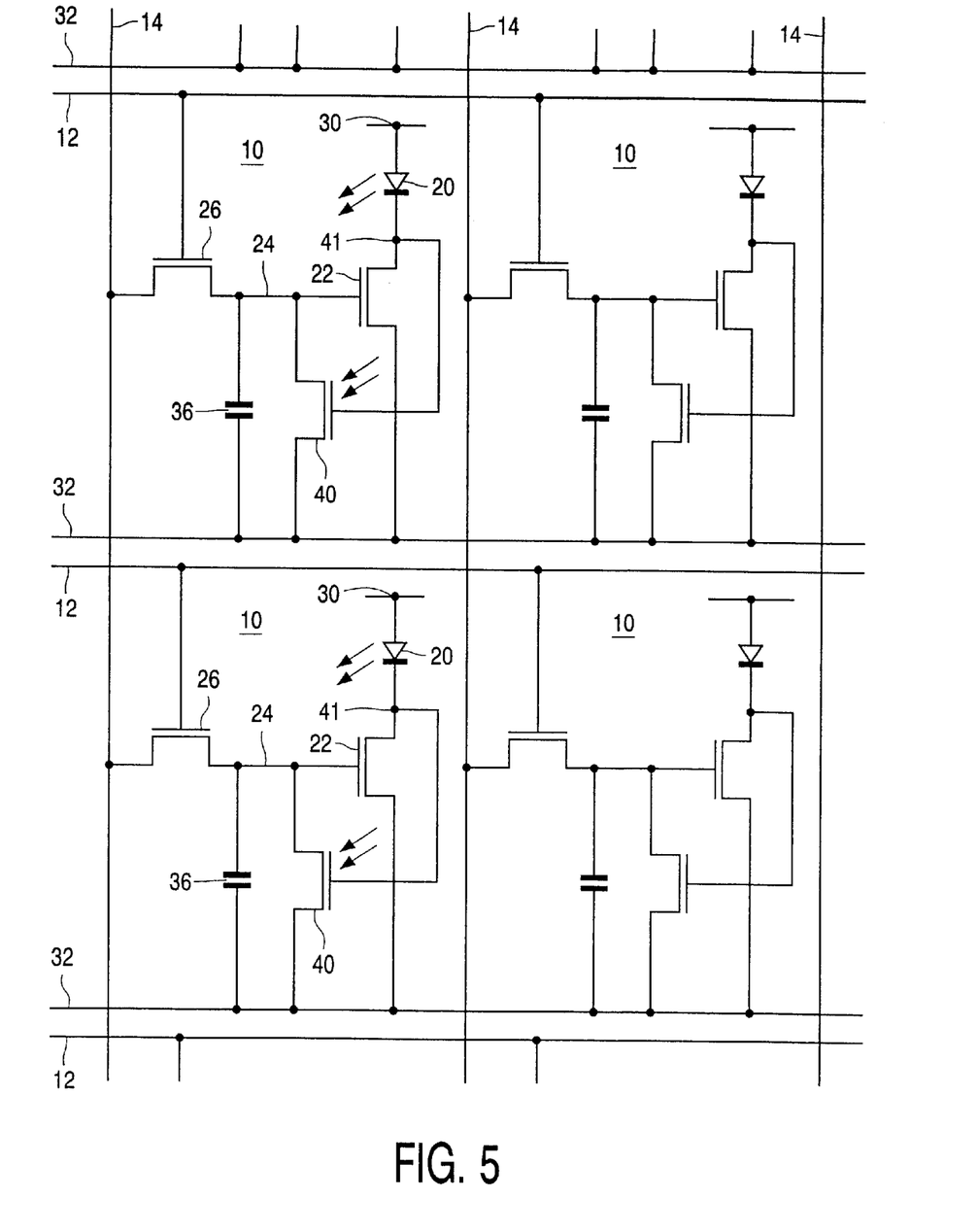
FIG. 5 shows the equivalent circuit of a few typical pixels in a second embodiment of active matrix electroluminescent display device according to the invention.

Referring to FIG. 5, there is shown the equivalent circuit of a few typical pixels in a second embodiment of display device according to the invention employing an electro-optical feedback circuit for overcoming, at least to an extent, the effects of ageing. In each pixel 10 the display element 20 is similarly connected in series with the drive transistor 22 (again operating in saturation mode) between the common current line 32, for example at ground potential, and the voltage supply line 30, at a positive potential with respect to the line 32, here shown constituted by a common anode electrode layer shared by all the pixels, and the gate and source of the address transistor 26 are connected to the associated row and column conductors 12 and 14 respectively. As before, the storage capacitor 36 is connected between the gate node 24 of the drive transistor 22 and the current line 32.

The pixel 10 further includes electro-optic discharging means comprising a photo-responsive device 40 which here comprises another TFT whose source and drain electrodes are connected across the storage capacitor 36, to the gate node 24 of the drive transistor 22 and the current line 32, and whose gate is connected to the node, 41, between the drive transistor 22 and the display element 20. In the case when the drive transistor 22 comprises an n-type low temperature polysilicon TFT, the device 40 is of a similar type.

The pixel is constructed and arranged in such a way that the photoresponsive device 40 is exposed to some of the light emitted by the display element 20 in operation of the pixel. The consequence of such optical coupling between these components will become apparent from the following description of the pixel's operation.

As with the known pixel circuit and the previous embodiment, operation of this pixel circuit has two phases, an addressing phase in which the pixel is set to a desired display output condition dependent on an applied data signal and a subsequent drive phase in which the display element is driven according to the set condition until the pixel is again addressed, for example in the next frame. In the addressing phase, the row driver circuit 16 applies a selection pulse signal to the row conductor 12 in a respective row address period which turns on the TFT 26 of each pixel in the row, and respective data voltage signals are applied to the column conductors 14 by the driver 18. The capacitor 36 is assumed for simplicity here to be fully discharged at the start of the addressing period. As a consequence, a voltage is set on the gate node 24 of the drive TFT 22 according to the level of the data signal and the capacitor 36 is charged to this voltage level, which, after removal of the selection pulse at the end of the row address period, serves to maintain the gate voltage of the TFT 22 at least initially in the subsequent drive phase as in the known pixel.

The drain junction of the photo-responsive TFT 40, which is coupled to the gate node of the TFT 22, is reverse biased. This junction is photosensitive and, as a result of the device 40 being optically coupled with the display element 20 light emitted by the display element in the drive period falling on this device, causes a small photocurrent to be produced in the device 40 which, because it is reverse biased, is approximately linearly proportional to the display element's instantaneous light output level. The effect of this photocurrent is to slowly discharge the storage capacitor 36, the amount of photocurrent, and thus the rate of discharge, being dependent on the light output level of the display element. At this initial stage of the drive period, the voltage on the gate of the device 40, corresponding to the voltage at the node 41, is relatively small and below the threshold voltage level of the transistor 40. Accordingly, because of the photocurrents generated therein, the transistor 40 behaves at this time merely as a leakage device, in the manner of a reverse biased photodiode, leading to charge on the capacitor 36 leaking away therethrough.

Consequently, the capacitor 36 slowly discharges in the drive period and the voltage on the gate of the drive TFT 22 gradually reduces to lower the current flowing through the display element 20 as the TFT 22 approaches its threshold, turn-off, level. The light output of the display element decreases in corresponding fashion with the reduction of the gate voltage. The reduction in current flowing through the display element 20 leads to a gradual increase in the voltage level at the node 41 and at a certain point in time, corresponding to the light output level attaining a predetermined lower limit, the voltage at the node 41 relative to the line 32 reaches the threshold voltage level of the transistor 40 causing the transistor 40 to abruptly turn on. The effect of this is to discharge very rapidly the capacitor 36, and to bring the gate voltage of the TFT 22 to the potential level of the line 32, thereby quickly turning off the TFT 22 and preventing any further current flow through the display element 20 so that light output from the pixel suddenly ceases. Thus, the light output is terminated at a defined stage during the drive period when the level of this light output falls to a particular level. As examples of typical voltages present in operation of the pixel, assuming for example that both TFTs 22 and 40 have a 5 volt threshold, the voltage supply line 30 may be at around 8 volts, the common current line 32 may be at 0 volts, and as the voltage at the gate node of the transistor 22 changes from 10 to 6 volts the voltage at the node 41 can change from 2 volts to 5 volts.

Figure 6:
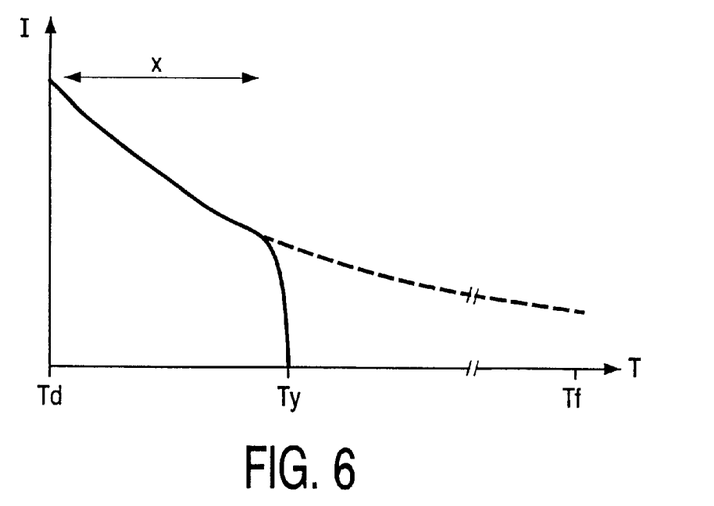
FIGS. 6 and 7 are graphs illustrating the operation of a representative pixel in the device of FIG. 5.

The operation of the pixel in this respect is illustrated graphically in FIG. 6 which shows the relationship between the display element's instantaneous light output level, I, (i.e. the number of photons emitted per second) and time, T. On the time axis, Td denotes the start of the pixel's drive period, immediately following its address period, and Tf represents the end of the frame period. At the beginning of the drive period, therefore, the light output from the display element is relatively high (as determined by the applied data signal). Photocurrent generated in the device 40 then has the effect of gradually, and generally linearly, reducing the gate voltage of the TFT 22, so that the display element's light output level decreases in corresponding fashion, as shown in the region X in FIG. 4. Upon the gate threshold voltage level of the device 40 being attained at the node 41, as a result of the drive current through the display element falling to a certain lower limit, the device 40 switches on, at point Ty, whereupon the TFT 22 rapidly turns off and light output from the element 20 ceases.

The dotted portion of the curve shown in FIG. 6 illustrates the light output effect which could be obtained if simply a photo-responsive device such as a reverse-biased photo-diode as in the first embodiment were to be connected across the capacitor 36 instead of the device 40. As can be seen, there would then be a much slower switch off of the current through the display element. Due to the photon output of the display element gradually decreasing to a comparatively low-level and the typical response behaviour of a photodiode, a long "tail" in the curve will likely result as shown. Such a tail makes control at low light levels more difficult as, firstly, the drive TFT 22 is operating close to its threshold voltage level at this stage and, secondly, light emission is occurring in the least efficient part of the photodiode characteristic. The pixel circuit in this second embodiment overcomes such problems with grey-scales being easier to achieve and efficiency improved.

The length of time over which the display element is energised in part determines the total amount of light output, and hence brightness (the initial current drive level also being a factor) and this period can vary up to a maximum corresponding to the frame period (Tf) at which time the pixel is again addressed. The light which is output by the display element during the drive period is integrated by the eye of a viewer and hence the amount of light, brightness, perceived by the viewer effectively is proportional to the area below the curve. Through the operation of the discharging means, this area, i.e. integral of the light output, can be made to remain substantially the same for a given data signal regardless of degradation in individual display elements.

In order to vary the light output from a display element in a frame period, and thus its grey-scale, the charge placed on the gate node of the TFT 22 during the addressing period is adjusted appropriately by increasing or decreasing the data signal voltage level. If the charge is increased, more photons are required from the display element during the discharging period before the TFT 22 switches off and vice versa.

Because the light output of the display element diminishes over the frame, then to obtain a similar maximum level of brightness to that achieved by an undegraded pixel in a conventional device in which the light input level remains substantially constant for the frame period, such brightness corresponding to the area below the curve in FIG. 6, then the maximum value of the applied data signal can be increased so that the initial illumination level (at Td) is increased. Alternatively, and perhaps preferably, the level of the drive voltage applied to the display element can be adjusted appropriately, for example by raising the voltage level of the line 30.

Figure 7:
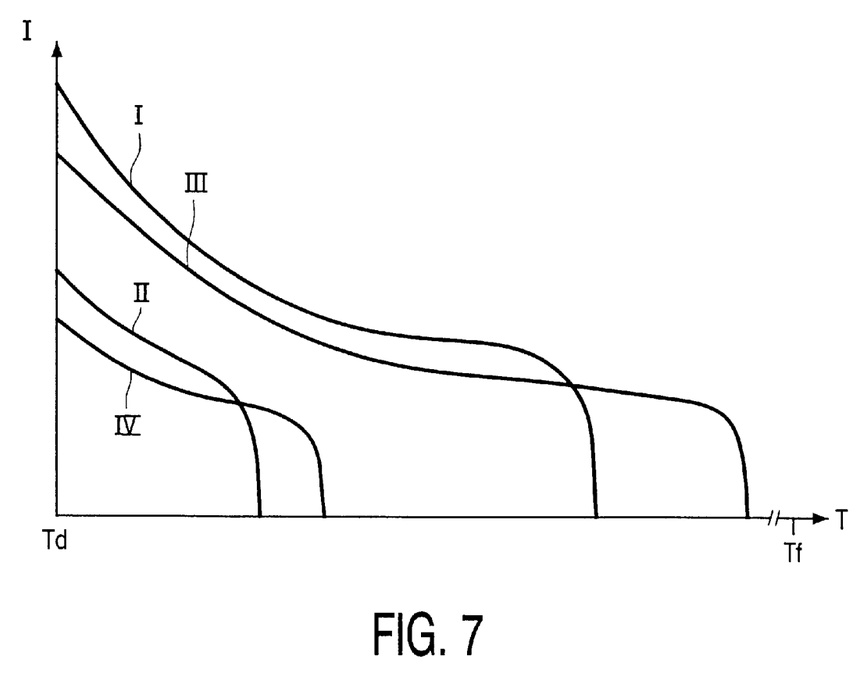

FIG. 7 is similar to FIG. 6 but graphically illustrates the operation of a pixel at different drive levels and the effects of ageing. In this graph, curves I and II represent light output for two different levels of applied data signal at an early stage in the device's operating life, the level for I being higher than the level for II. It is clearly seen that the areas bounded by these two curves are substantially different. The curves III and IV show the effect of ageing and degradation in the display element at a later stage in the device's life for similar data signal levels used for the obtaining the curves I and II respectively. Comparing curves I and III, therefore, it is seen that the light output level initially and throughout the drive period is reduced through the effects of ageing but that, as a result of the operation of the discharging means, the total amount of light produced, as determined by the area beneath the curve, is maintained by the period of energisation being varied (increased) appropriately. Curves II and IV show a similar result for a lower light output level.

The discharging means comprising the photo-responsive transistor 40 does not have any appreciable effect during the addressing period. At the beginning of the next addressing period, the transistor 40 is still on. However, the voltage drop across this transistor means that the gate node of the transistor 22 will rise upon the application of the new data signal and transistor 22 will start to conduct, thereby lowering the voltage at the node 41 and causing the transistor 40 to turn off. A small resistor can be connected between the drain of the transistor 40 and the junction between the capacitor 36 and the gate of the transistor 22 if required to ensure such operation. Because the addressing period is significantly shorter than the drive period, for example less than 32 microseconds with a frame period of around 20 milliseconds, the effects of the leakage through the transistor 40 thereafter due to photocurrents during the addressing period are not significant.

The photo-responsive transistor 40 is entirely compatible with the drive TFT 22 (both can be formed as low temperature polysilicon TFTs of the same type, e.g. n type), and typical levels of photocurrents generated in the transistor 40 in operation are compatible with an easily integrated storage capacitor.

Besides compensating automatically for display element ageing effects, the manner of operation of the pixel circuit (and likewise that of the first embodiment) means also that it is effective to compensate automatically for variations in the operational characteristics of the TFTs 22 of different pixels in the array resulting, for example, from variations in their threshold voltages, dimensions, and mobilities due to the nature of the thin film fabrication processes used to form the TFTs. As a result, further improvement in the uniformity of light output from the display elements over the array is achieved. In addition, the pixel circuit assists in avoiding unwanted effects caused in the drive period by voltage drops occurring in the common current lines 32 and 30.

The TFTs used in the above described embodiments of pixel circuits all comprise n-channel MOS TFTs. However, p-channel TFTs could be used instead, with the polarity of the display element 20, and the applied drive voltages being reversed. In this case, references to discharging used herein should be construed accordingly, as will be apparent to skilled persons. Preferably, polysilicon TFTs are used, although alternatively amorphous silicon TFTs could be employed.

Although the transistor 40 is arranged so that it is exposed to light emitted by the display element 20, it is preferably shielded from ambient light falling on the device so that it is responsive in operation solely to light from the display element.

The current lines in the above embodiment may instead extend in the column direction with each current line then being shared by a respective column of pixels.

Although in this second embodiment a photoresponsive transistor is preferred for the opto-electronic discharging means, it is envisaged that the discharging means could be of a different form, for example comprising a switching device such as a TFT and a separate photodiode connected in parallel across the capacitor 36 with similarly the gate of the TFT being connected to the node 41 and with the photodiode being reverse-biased. It is envisaged also that operation of the switching device of the discharging means may be controlled other than by connecting its gate to the node 41, for example by connecting its gate to some other point in the pixel circuit whose voltage varies in accordance with drive current flowing through the display element such that the switching device is turned on in response to the drive current falling to a certain lower level.

The operation of the discharging means in switching to rapidly discharge the storage capacitor may alternatively be controlled by a current in the pixel circuit which varies in accordance with current flow through the display element or by means of an optically sensitive switch circuit which is responsive directly to the light emitted by the display element and which has a threshold characteristic so as to switch to discharge the capacitor upon the level of the light received by the circuit dropping to a predetermined value.

Figure 8:
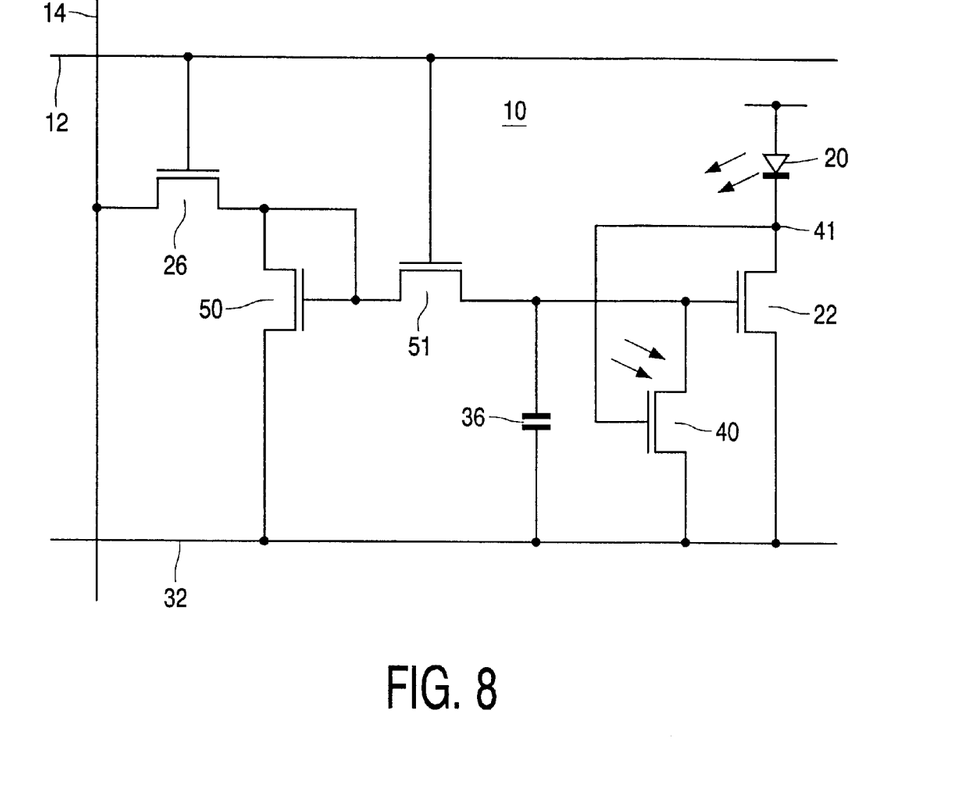
FIG. 8 shows the equivalent circuit of an alternative form of pixel in another embodiment according to the invention.

The invention can be used also with pixels driven using a current data signal rather than a voltage data signal as in the above-described embodiment. FIG. 8 illustrates another form of pixel circuit suitable to be used with current data signals. The same reference numbers are used to designate corresponding components. Apart from the discharging means 40, this pixel circuit is similar to an example described in WO99/65012 to which reference is invited for a detailed description. Briefly, the pixel circuit includes additionally two further TFTs 50 and 51 interconnected between the gate node of the TFT 22, the line 32 and the output of the address TFT 26 as shown. The further TFT 50 and the TFT 22 form a current mirror circuit whose operation provides in the pixels compensation for variation in the threshold voltage of the TFTs 22.

In a row address period the TFTs 26 and 51 are turned on and the TFT 50 samples an input, data, current flowing in the conductor 14 via the TFT 26. This current is mirrored by the TFT 22 to produce a proportional current through the display element 20. Once the current has stabilised, the voltage across the storage capacitor 36 becomes equal to the gate voltage on the TFTs 22 and 50 required to produce this current.

The discharging means 40 behaves in the subsequent drive period as in the previous embodiment.

Thus, in summary, an active matrix electroluminescent display device has been described in which the drive current through an electroluminescent display element in each pixel in a drive period is controlled by a driving device based on a drive signal applied during a preceding address period and stored as a voltage on an associated storage capacitor. In order to counteract the effects of display element ageing, through which the light output for a given drive signal level diminishes over time, the pixel includes electro-optic discharging means coupled to the storage capacitor and responsive to the display element's light output to leak stored charge and to control the integrated light output of the display element in the drive period. For improved control, the discharging means is arranged to rapidly discharge the capacitor at a controlled point in the drive period, upon the drive of the display element falling to a low level. A photoresponsive transistor can conveniently be utilised for this purpose.

From reading the present disclosure, other modifications will be apparent to persons skilled in the art. Such modifications may involve other features which are already known in the field of active matrix electroluminescent display devices and component parts therefor and which may be used instead of or in addition to features already described herein.

What is claimed is:

1. An active matrix electroluminescent display device, comprising:
    an array of display pixels, each display pixel including
        an electroluminescent display element and a driving device for controlling the current through said electroluminescent display element in a drive period based on a drive signal applied to said electroluminescent display pixel during an address period preceding the drive period and stored as a charge on a storage capacitance associated with said driving device, and
        electro-optic discharging means coupled to the storage capacitance for controlling the amount of light output from said display pixel in the drive period, said electro-optic discharging means being responsive to light produced by said electroluminescent display element during the drive period and arranged to leak charge from the storage capacitance at a rate dependent on an output level of light of said electroluminescent display element in the drive period,
        wherein said electro-optic discharging means rapidly discharges the storage capacitance and curtails light output from said electroluminescent display element at a point in the drive period which is controlled by, and dependent on, an operation of said electroluminescent display element, and
        wherein a controlled point at which said electro-optic discharging means operates to rapidly discharge the storage capacitance is determined by an operational characteristic of said display pixel indicative of the light output of said electroluminescent display element reaching a certain low level.

2. The active matrix electroluminescent display device of claim 1, wherein the controlled point at which said electro-optic discharging means operates to rapidly discharge the storage capacitance is determined by an electrical parameter that varies in accordance with the drive level of said electroluminescent display element.

3. The active matrix electroluminescent display device of claim 2, wherein the operation of said electro-optic discharging means to rapidly discharge the storage capacitance is controlled according to the level of electrical current flowing through said electroluminescent display element.

4. The active matrix electroluminescent display device of claim 1, wherein said electro-optic discharging means includes a switching device connected across the storage capacitance and operable to rapidly discharge the storage capacitance.

5. The active matrix electroluminescent display device of claim 4,
   wherein said driving device includes a transistor connected in series with said electroluminescent display element, and
   wherein an operation of said switching device is controlled by a voltage across said driving device.

6. The active matrix electroluminescent display device of claim 4, wherein said driving device and said switching device include TFTs.

7. The active matrix electroluminescent display device of claim 6, wherein said electro-optic discharging means includes a photo-responsive element connected across the storage capacitance and responsive to light output from said electroluminescent display element to leak charge from the storage capacitance.

8. The active matrix electroluminescent display device of claim 7 wherein said photoresponsive element includes a reverse biased photodiode.

9. The active matrix electroluminescent display device of claim 4,
   wherein said electro-optic discharging means includes a photo-responsive transistor through which charge on the storage capacitance is leaked by photocurrent generated therein by light from said electroluminescent display element, and
   wherein a gate of the photo-responsive transistor is coupled to a source of potential dependent on current flow through said electroluminescent display element.

10. The active matrix electroluminescent display device of claim 9,
    wherein said gate of said photo-responsive transistor is further coupled to a node between said electroluminescent display element and said driving device.

* * * * *